(12) United States Patent
Calvignac et al.

(10) Patent No.: US 6,642,865 B2
(45) Date of Patent: *Nov. 4, 2003

(54) SCALABLE INTERFACE AND METHOD OF TRANSMITTING DATA THEREON

(75) Inventors: Jean Louis Calvignac, Cary, NC (US);
Jeffrey James Lynch, Apex, NC (US);
Fabrice Jean Verplanken, La Gaude (FR)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 10/095,489

(22) Filed: Mar. 12, 2002

(65) Prior Publication Data

US 2003/0184458 A1 Oct. 2, 2003

(51) Int. Cl.$^7$ .................................. H03M 7/00
(52) U.S. Cl. .......................... 341/102; 341/51
(58) Field of Search ............................. 341/51, 68, 55, 341/69, 95, 102

(56) References Cited

U.S. PATENT DOCUMENTS

| | | | |
|---|---|---|---|
| 4,016,368 A | 4/1977 | Apple, Jr. et al. | 179/15 BS |
| 4,367,549 A | 1/1983 | Vachee | 370/91 |
| 4,581,737 A | 4/1986 | Sparrell | 370/110.1 |
| 4,622,666 A | 11/1986 | Graves et al. | 370/100 |
| 5,068,899 A | 11/1991 | Ellis et al. | 381/31 |
| 5,357,249 A | 10/1994 | Azaren et al. | 341/100 |
| 5,420,583 A | * 5/1995 | Knecht et al. | 341/59 |
| 5,442,405 A | 8/1995 | Taniguchi et al. | 348/525 |
| 5,570,089 A | 10/1996 | Haas | 341/102 |
| 5,614,901 A | 3/1997 | Haas | 341/68 |
| 5,822,328 A | 10/1998 | Derby et al. | 370/507 |
| 6,058,149 A | 5/2000 | Sato | 375/365 |
| 6,198,753 B1 | 3/2001 | Virdee et al. | 370/509 |

OTHER PUBLICATIONS

J. L. Calvignac et al., Pending patent application Ser. No. 10/096,161, "Method and Apparatus for Transmission on a 2–Bit Channel Using 3B/4B Code", IBM Docket No. RAL920010022US2, filed Mar. 12, 2002.

* cited by examiner

Primary Examiner—Brian Young
(74) Attorney, Agent, or Firm—Joscelyn G. Cockburn (57) ABSTRACT

Described is a scalable interface including a plurality of 2-bit transmission channels. An encoder partitions a digital bit stream into 3 bits which are coded into 4 bits with each pair of bits in each 4 bit pattern transmitted via back-to-back clock cycles on separate ones of the channels.

19 Claims, 10 Drawing Sheets

CLOCK

BIT A

BIT B

CODED PATTERN TRANSMITTED IN 2 CONTIGUOUS CYCLES

CODED (4b) PATTERNS

BINARY (3b) PATTERNS

AB = 11: FRAMING PATTERN

AB = 11: FRAMING PATTERN b1b2b3b4 b1b2b3b4 b1b2b3b4 b1b2b3b4 b1b2b3b4 b1b2b3b4 b1b2b3b4 b1b2b3b4
0 0 0 0 1 0 0 0 0 0 1 0 1 0 1 1 0 0 0 1 1 0 0 0 1 0 1 0 0 1 a1a2a3  a1a2a3  a1a2a3  a1a2a3  a1a2a3  a1a2a3  a1a2a3  a1a2a3
 000     011     001     100     110     101     010     111

BINARY VALUE 00001100110011010101011

FIG. 2C

CODE TABLE

| BINARY PATTERN<br>a a a<br>1 2 3 | CODED PATTERN<br>b b b b<br>1 2 3 4 | |
|---|---|---|
| 0 0 0 | 0 0 0 0 | c0 |
| 0 0 1 | 0 0 0 1 | c1 |
| 0 1 0 | 0 0 1 0 | c2 |
| 0 1 1 | 0 1 0 0 | c3 |
| 1 0 0 | 0 1 0 1 | c4 |
| 1 0 1 | 0 1 1 0 | c5 |
| 1 1 0 | 1 0 0 0 | c6 |
| 1 1 1 | 1 0 0 1 | c7 |

ENCODING ↓ ↑ DECODING

FIG. 7C CODE TABLE

FIG. 8

SCALABLE INTERFACE AND METHOD OF TRANSMITTING DATA THEREON

CROSS REFERENCE TO RELATED PATENT APPLICATION

Patent application Ser. No. 10/096,161 entitled "METHOD AND APPARATUS FOR TRANSMISSION ON A 2-BIT CHANNEL USING 3B/4B CODE", assigned to the assignee of the present invention describes a Two Bit Channel and a 3-bit/4-bit coding scheme for transmitting information on said channel. The subject patent application is used to transmit status information from a sink or destination node to a source node.

The subject application is fully incorporated by reference into the present application which provides a scalable interface using the two bit channel, the 3-bit/4-bit coding and a method of distributing the 4 bits coding pattern over the scalable interface.

BACKGROUND OF THE INVENTION

1) Field of the Invention

The present invention relates to communications networks in general and in particular to apparatus and techniques used to interconnect components within devices coupled to said communications networks.

2) Prior Art

The proliferation of communications devices has created the need for uniform standards to which a manufacturer is obliged to observe in order to interconnect one manufacturer's equipment to the equipment of another manufacturer. The standards are, usually, not mandatory. But a manufacturer whose equipment does not comply with an adopted standard may not be able to communicate with equipment from other manufacturers. As a consequence, the sale of equipment from the non-complying manufacturer may be less than it would have been if he had complied.

As a consequence it is common industry practice for manufacturers to form working groups which promulgate standards pertaining to a particular technology. The Optical Internetworking Forum (OIF) is one of such working group which promulgates standards for OC-192 System Interface for Physical and Link Layer Devices. The interface is often referred to as the SPI-4 interface which interconnects Physical Layer (PHY) devices to Link Layer devices for 10 Gbps for aggregate bandwidth applications. Details of the SPI-4 interface is set forth in the OIF document titled: "System Packet Interface Level 4 (SPI-4) Phase 2: OC-192 System Interface for Physical and Link Devices" or its successor documents which can be obtained from Optical Internetworking Forum, 39355 California Street, Suite 307, Fremont, Calif. 94538 or successor organization and is incorporated herein by reference.

Figure 1:
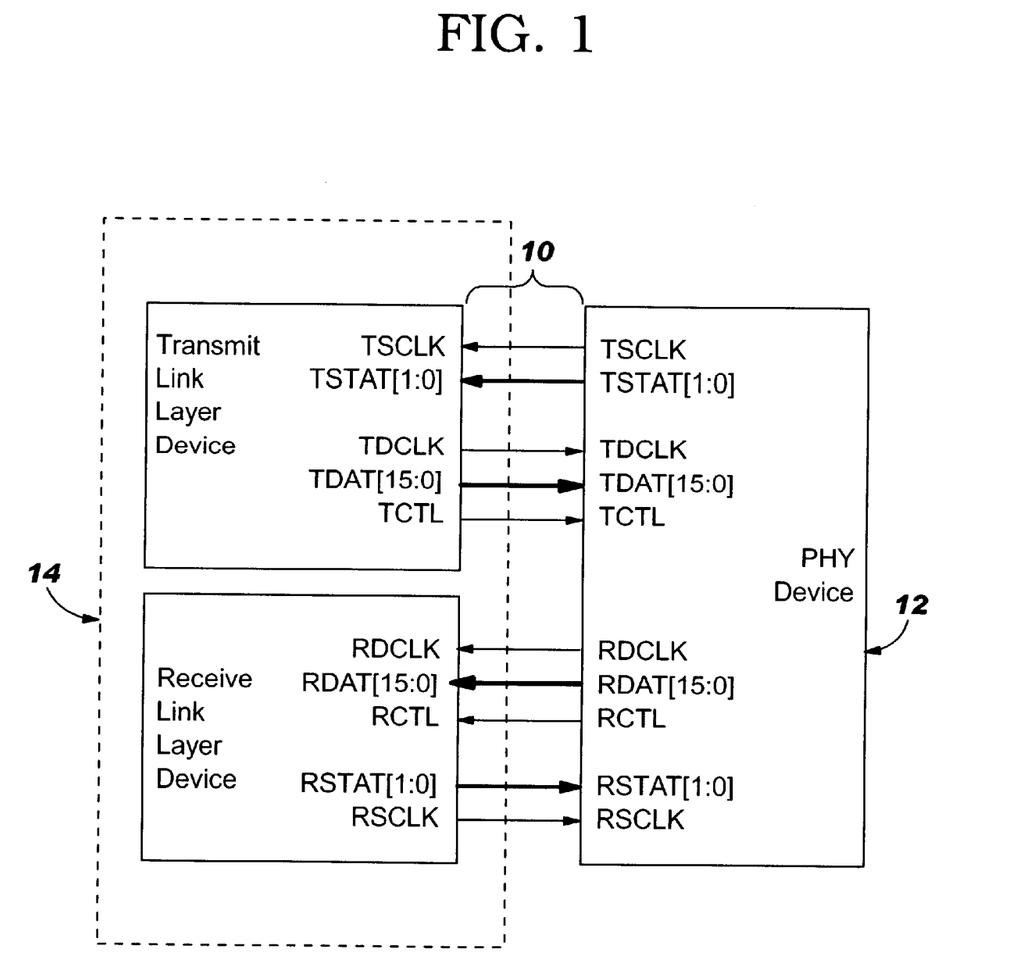
FIG. 1 is a block diagram showing the SPI-4 Interface coupling a PHY device to link layer device.

In order to set the background against which the present invention was developed portions of the SPI-4 Interface standard are described with reference to FIG. 1. The SPI-4 interface 10 is a Point-to-Point interface coupling PHY Device 12 to Link Layer Device 14. The Link Layer Device 14 includes Transmit Link Layer and Receiver Link Layer Device. The SPI-4 Interface 10 includes transmitting data clock (TDCLK), transmit data (TDAT) and transmit control (TCTL). The named signals are from the Transmit Link Layer Device to PHY Device 12. Likewise, SPI-4 Interface 10 includes receive data clock (RDCLK), receive data (RDAT) and receive control (RCTL) from PHY Device 12 to the Receive Link Layer Device. Associated with the RDCLK, RDAT and RCTL are RSTAT and RSCLK. RSTAT is a 2-bit channel transmitting status information from Receive Link Device to PHY Device 12. Clock signal associated with the 2-bit channels is transported on RSCLK. A 2-bit channel labelled TSTAT and clock line labelled TSCLK associated with TDCLK, TDAT and TCTL, carries status information from PHY Device 12 to Transmit Link Layer Device. The arrows in FIG. 1 indicate the direction in which information flows.

The RSTAT channel, RSCLK, TSTAT and TSCLK relate to the present invention set forth herein below. As a consequence further discussion will be limited thereto. Except for flow direction, the characteristics and functions of TSCLK, TSTAT and RSTAT, RSCLK are identical. Therefore, only one set will be described with the understanding that the description relates to both pairs.

As defined in the standard the Status Channel (TSTAT or RSTAT) is a 2-bit digital channel with four unique bit patterns 00, 01, 10 and 11. The bit pattern '11' is the synchronization character and cannot be used to transmit useful information. In fact, only three bit patterns 00, 01, and 10 are available to transfer useful information. However, there are several situations requiring more than 3 (three) 2-bits independent bit pattern to transmit more complex information on the two bit status channels. As a consequence, there is a need to provide more independent bit patterns on the two bit status channel without altering its characteristics such as changing the '11' synchronizing bit pattern.

In addition, there are times when increased bandwidth is required to transmit information on the status channel.

SUMMARY OF THE INVENTION

The present invention increases the bandwidth on the status channel by providing a scalable interface including n 2-bit channels, n greater than 1. The information to be transmitted is distributed over the n channels. The increase in bandwidth is achieved without changing the clocking set forth in the above-identified document or '11' synchronization bit pattern. The bit pattern is increased by using a 3b/4b coding and not using predetermined bit patterns with '11', located in certain positions of the patterns, to transmit data.

In particular a digital stream of data to be transmitted on the n 2-bit channels is partitioned into groups of 3 bits which are encoded into 4 bits and each pair of the 4 bits is forwarded onto different 2-bit channels using the same or back-to-back clock cycles. Selected bit patterns with adjoining '11' are discarded and not used to transmit information on the 2-bit channel. Contiguous clock cycles are used to gate pairs of the coded 4 bits onto different 2-bit channels.

The efficiency is further enhanced by using a clock cycle to gate the "11" framing pattern onto one of the 2-bit channels and the first 4-bit pattern, in a set of 4-bit patterns, to be transmitted is distributed and gated by the same clock cycle over other 2-channels in the interface. Thereafter, the other 4-bit patterns in the set of patterns to be transmitted are distributed over the channels of the interface in a round robin manner, with the 2-bit channels in the interface operating simultaneously.

BRIEF DESCRIPTION OF THE DRAWINGS

FIG. 2, consisting of FIGS. 2A, 2B and 2C, shows a graphical representation of the coding scheme according to the teachings of the present invention.

FIG. 7, consisting of FIGS. 7A, 7B and 7C, shows a graphical representation of the scalable interface according to the teachings of the present invention.

DESCRIPTION OF THE PREFERRED EMBODIMENT

Figures 7A, 7B, 7C:
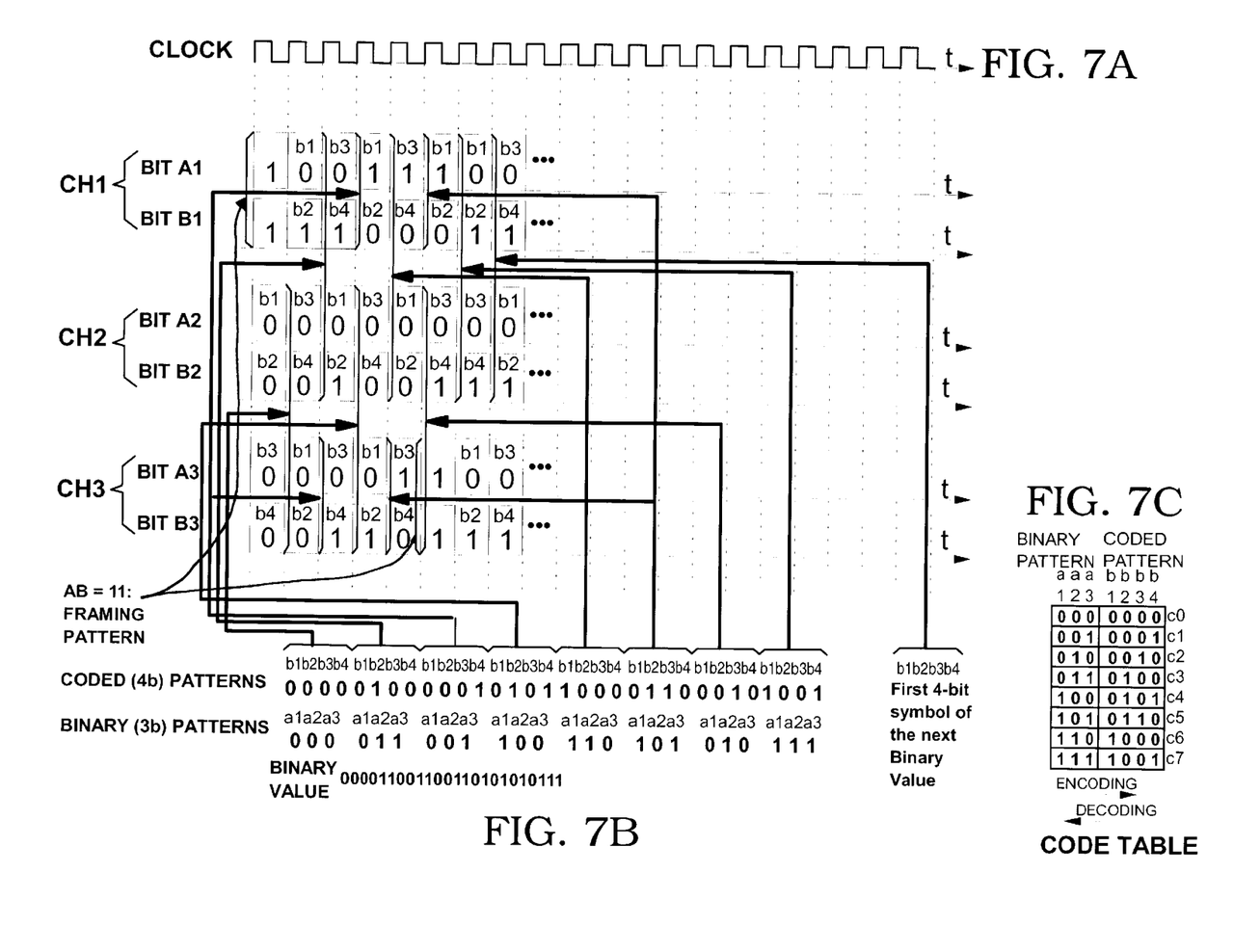
Figure 8:
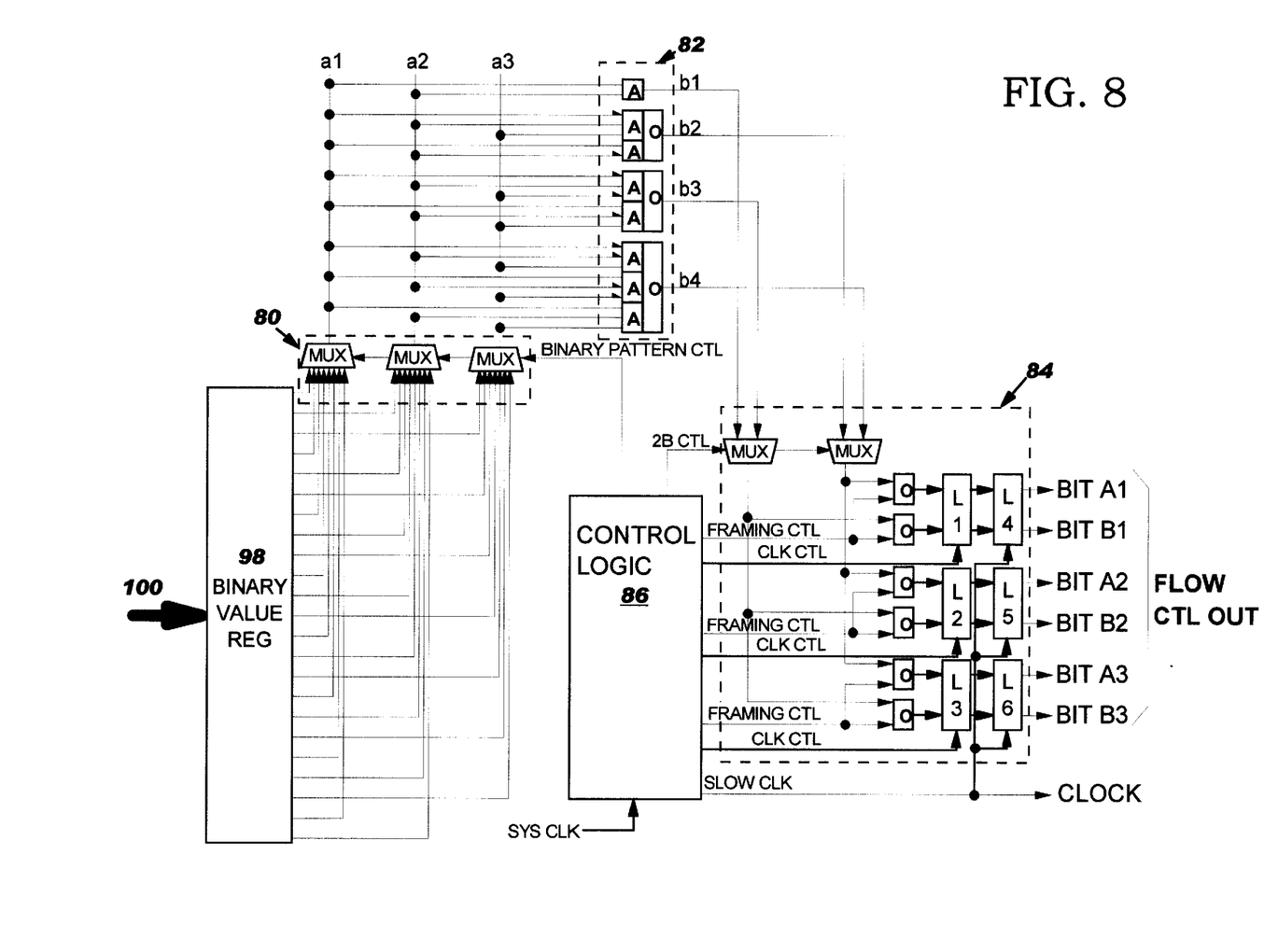
FIG. 8 shows a circuit/logic diagram of the encoder for the scalable interface.
Figure 9:
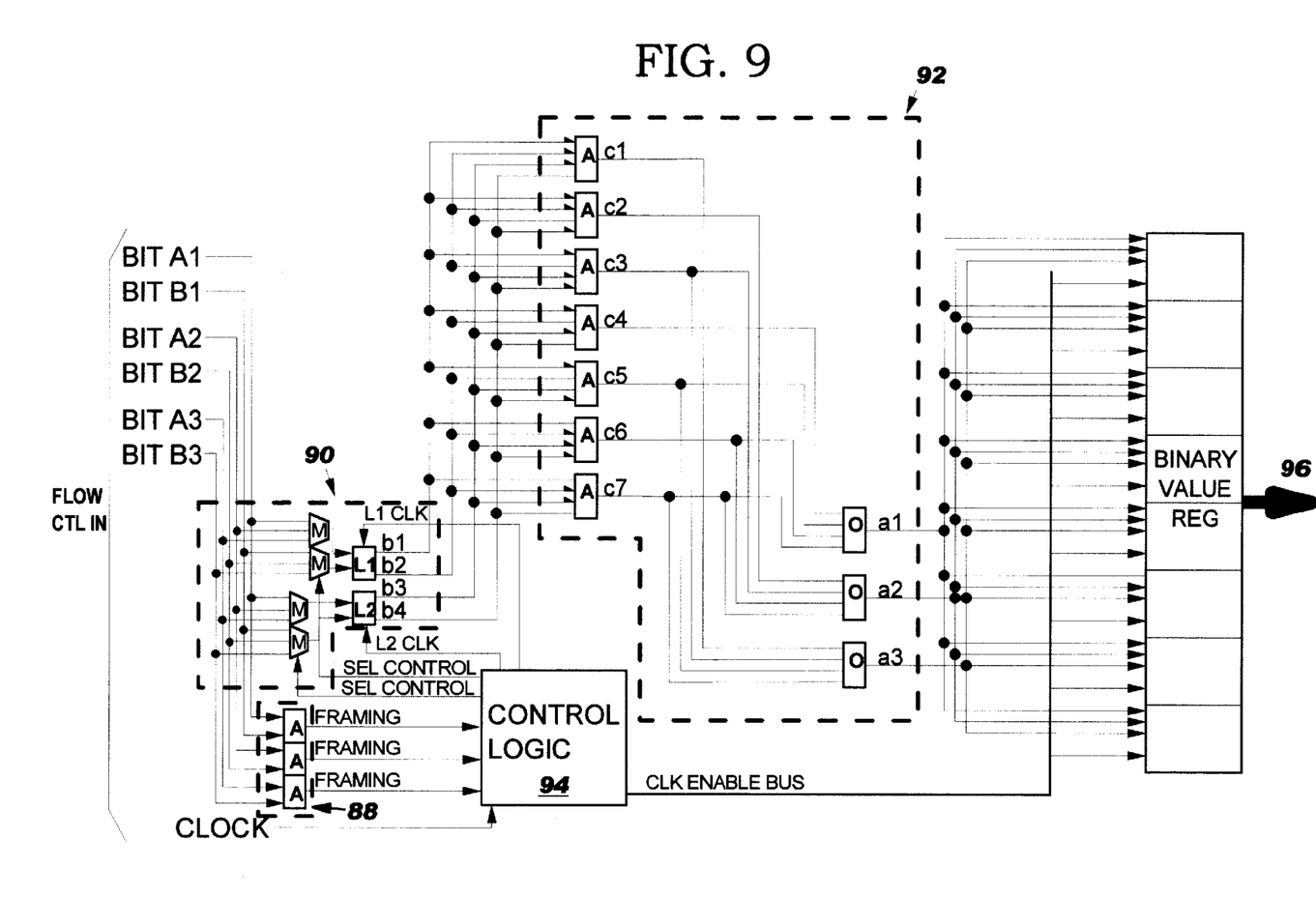
FIG. 9 shows a circuit/logic diagram of the decoder for the scalable interface.

In the embodiment FIGS. 1 through 6 and related description cover the 2-bit channel and 3b/4b coding on said 2-bit channel whereas FIGS. 7 through 9 and related description cover the scalable interface. The interface is scalable because it can be made wider by adding 2-bit channels constraining them to operate simultaneously or the interface can be made narrower by dropping or deactivating 2-bit channels.

Figure 2A:
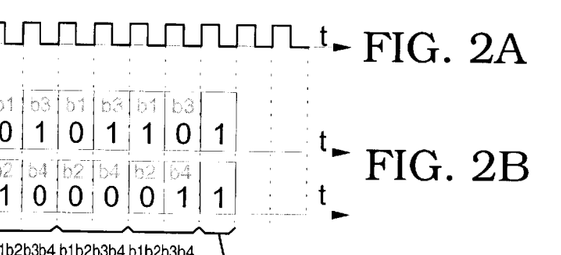
Figures 2A, 2B:
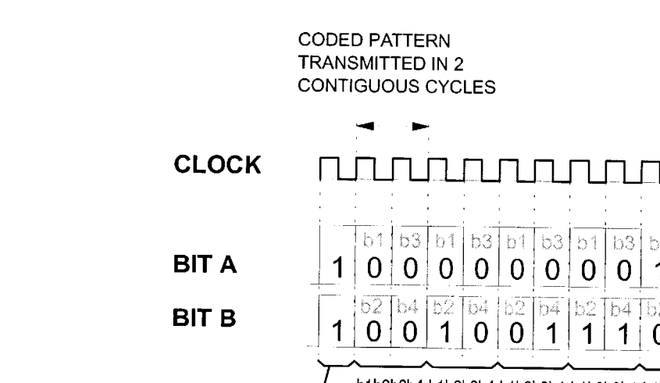
Figure 2C:
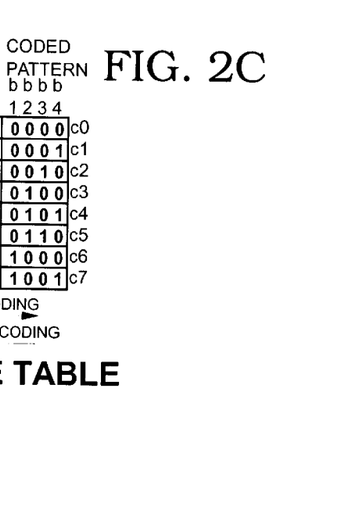

FIG. 2, consisting of FIGS 2A, 2B and 2C, shows a graphical representation of the coding scheme according to the teachings of the present invention. FIG 2A shows the clock which is transmitted on the timing channel associated with the status channel and transmits timing signals that delineate bits on the status channel. As is shown in FIG. 2A two contiguous cycles of clock pulses on the timing channel is used for gating each of the four transmitted bit patterns in the status channel.

FIG. 2B shows a graphical representation of the status channel labelled Bit A and Bit B. The status channel transmits status information from the sink to the source of the transmission. Turning to FIG. 1 for the moment for signals transmitted from Transmit Link Layer Device over TDCLK, TDAT and TCTL to the PHY Device, the Transmit Link Layer Device is the source and the PHY Device is the sink. Likewise, for signals transmitted from PHY Device to Receive Link Layer Device over RDCLK, RDAT and RCTL, PHY Device is the Source and Receive Link Layer Device is the Sink.

Referring again to FIG. 2, the status channel is a 2-bit channel described in the SPI-4 interface, incorporated herein by reference. The channel can be two wires, optical or any other type of transmission medium. The channel transmits a pair of '11' bits which are used for framing or delimiting a data structure in the channel. Data transmissions on the channel are coded as 4b patterns transmitted in pairs of two transmitted in two contiguous clock cycles. For example, the transmission patterns are b1b2b3b4 transmitted in pairs. As a consequence, for any transmission pattern b1b2 is transferred in the first cycle followed by b3b4 in the second contiguous cycle. Because this is a 3-bit 4-bit coding scheme each group of 3 bits to be transmitted on the channel are coded into 4 bits. For example, if a string of binary characters labelled BINARY VALUE (FIG. 2) is to be transmitted in the 2-bit channel, it is first partitioned into groups of 3 bits ($a_1$ $a_2$ $a_3$). In FIG. 2 the first group would be '000', the second group would be '011', the third group would be '001' and so forth. Because the binary length is 24 bits eight 3-bit binary patterns are generated and each 3-bit binary pattern is encoded into 4 bits and transmitted on the channel. At the receiver the reverse is practised. The 4 bits are received from the channel, decoded into 3 bits and then converted back into the digital string.

FIG. 2C shows a code table for the binary patterns and coded patterns. Each of binary patterns contains 3 bits (a1a2a3). Because 3 bits are in the group the number of independent binary patterns would be $2^3$=8. The 8 values are shown in the table from '000' to '111'. The table also shows the coded patterns. In a similar manner the number of independent coded patterns generated from 4 bits would be $2^4$=16. However, not all of the 16 unique patterns can be used because '11' is the framing pattern and cannot appear in certain positions of the coded patterns transmitted in the status channel. As a consequence, the framing pattern '11' cannot be present in b1b2 or b3b4. However, this pattern can be present in b2b3 as is shown in c5 of the table. When the ineligible coded patterns are removed from the 16 available coded patterns the 8 patterns shown in the coded table are available for transmitting information on the status channel. The coded patterns that are not available for transmitting information include 0011, 0111, 1011, 1100, 1101, 1110 and 1111. It should be noted that 1010 is an eligible pattern but is not used in the Code Table.

As can be seen in FIG. 2C the arrow labelled Encoding goes from left to right and illustrates that each of the binary patterns is coded into a specific 4-bit pattern. Likewise, the decoding goes from right to left and illustrates that each of the coded patterns is decoded into the corresponding 3-bit binary pattern shown in the table. Thus, by partitioning a digital string into 3 bits, coding the 3 bits into 4 bits and transmitting the 4 bits down a 2-bit status channel provides the mechanism wherein a large amount of information can be transmitted on a 2-bit channel. This the prior art SPI-4 2-bit channel could not have done. Therefore this invention significantly improves and adds value to the prior art scheme set forth in SPI-4 standard.

Figure 3A:
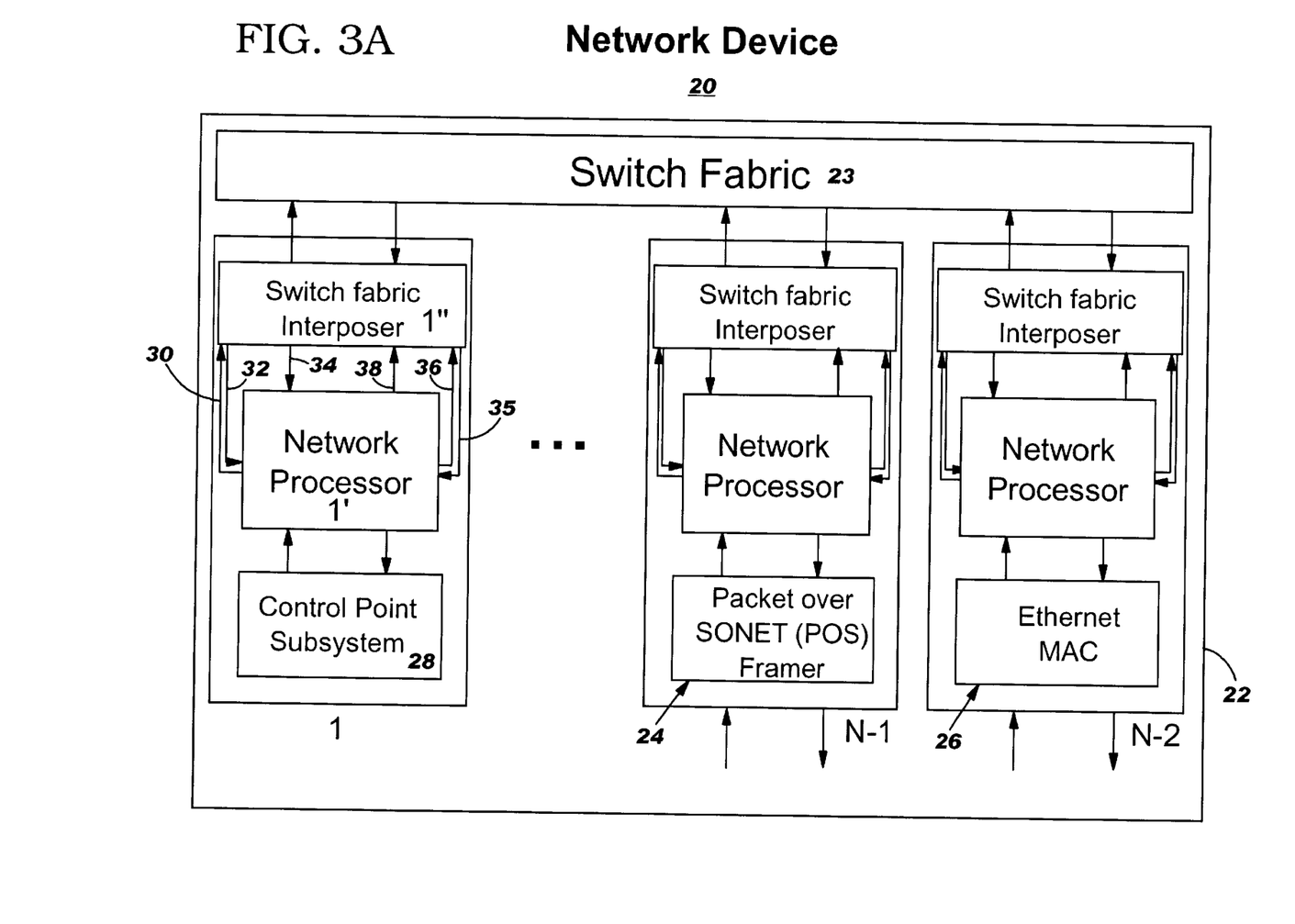
FIG. 3A shows a block diagram of a system including the teachings of the present invention.

FIG. 3A shows Network Device 20 in which the present invention is implemented. Network device 20 may be a switch router or any of the other conventional network devices. The Network Device 20 includes a housing 22 in which a plurality of blades labelled 1 through N, N−1, and N−2 are mounted. The blades are interconnected by Switch Fabric 23. Except for management blade 1 the blades are interconnected through appropriate network interfaces to different types of communications networks. For example, in FIG. 3 blade N−1 is connected through media interface 24 to an appropriate communications network. In particular, interface 24 is labelled "Packet over SONET (POS) Framer" which is an interface for handling information to and from an optical network. Likewise, interface 26 labelled "Ethernet MAC" handles communications with an ethernet network. The management blade 1 provides management for the overall network device. To this end, it includes a control point subsystem 28 that performs most if not all of the management functions and/or functions that cannot be performed by the other blades. The function provided by control point subsystem 28 is well known in the art, therefore further description of the function will not be given. Suffice it to say that the control point subsystem 28 could be a general purpose computer shown in FIG. 3B.

Figure 3B:
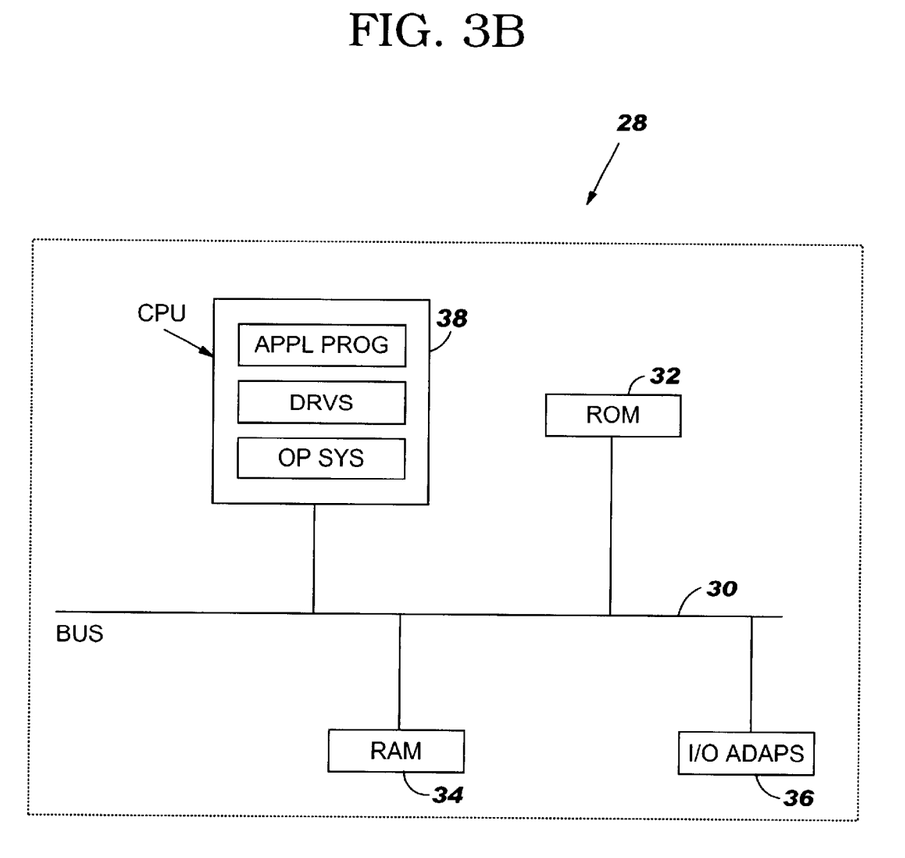
FIG. 3B shows a block diagram of the Control Point Subsystem.

Turning to FIG. 3B for the moment, the control point subsystem 28 includes bus 30 to which ROM 32, RAM 34, I/O Adapters 36 and CPU 38 are connected. The RAM is used as a scratch pad by the system whereas the ROM stores instructions. I/O Adapter 36 can be used to attach external devices such as a mouse, keyboard, scanner, etc. The CPU 38 includes an operating system, drivers and application programs. The functions which each of these entities provides are well known in the art and will not be discussed further.

Referring again to FIG. 3A, each of the blades includes a Network Processor coupled by a switch fabric interposer to the Switch Fabric 23. The Switch Fabric 23 could be a cross-point switch which provides communication between the various blades in the device. The switch fabric interposer provides the interface between the network processor and the Switch Fabric 23. Among the functions provided by the switch fabric interposer is the structuring of data so that it can be exchanged between the network processor and the Switch Fabric 23. For example, the switch fabric uses a cell type data unit such as that used in ATM technology. The switch fabric interposer would package data from the network processor to the switch into the cell size used by the switch and generate the necessary control that is required for the switch to work in an acceptable manner. Likewise, data from the Switch Fabric 23 is converted into a format that the network processor understands. The Switch Fabric 23 can be any cross-point packet switch such as the switch termed PRIZMA manufactured and marketed by IBM Corporation. Because the network processor on each of the blades are the same, only one will be discussed. The network processor 1' is coupled to the switch fabric interposer 1" by transmit data bus 30, flow control in status channel 32 and flow control in clock channel 34. Transmit data channel 30 transmits data from network processor 1' to the switch fabric interposer 1". Flow control in status channel 32 transmits status information from the switch fabric interposer 1" to network processor 1'. Likewise, flow control in clock channel 34 transmits the clocking signals shown in FIG. 1A from the switch fabric interposer 1" to network processor 1'.

Still referring to FIG. 3A, network processor 1' is also connected to switch fabric interposer 1" by receive data bus 35, flow control out status channel 36 and flow control out timing channel 38. Receive data bus 35 transmits data from the switch fabric interposer 1" to network processor 1'. Flow control out status channel 36 transmits status information from network processor 1' to switch interposer 1". Flow control out timing channel 38 transmits the timing pulses that are associated with flow control out status channel 36. The interconnection of the other network processors, their operation etc., with their respective switch fabric interposer are identical to those described relative to blade 1. Therefore, further description of the interconnections will not be given it being understood that the interconnections and description for blade 1 is intended to cover the network processors and interconnection relative to the other blades.

Figure 4:
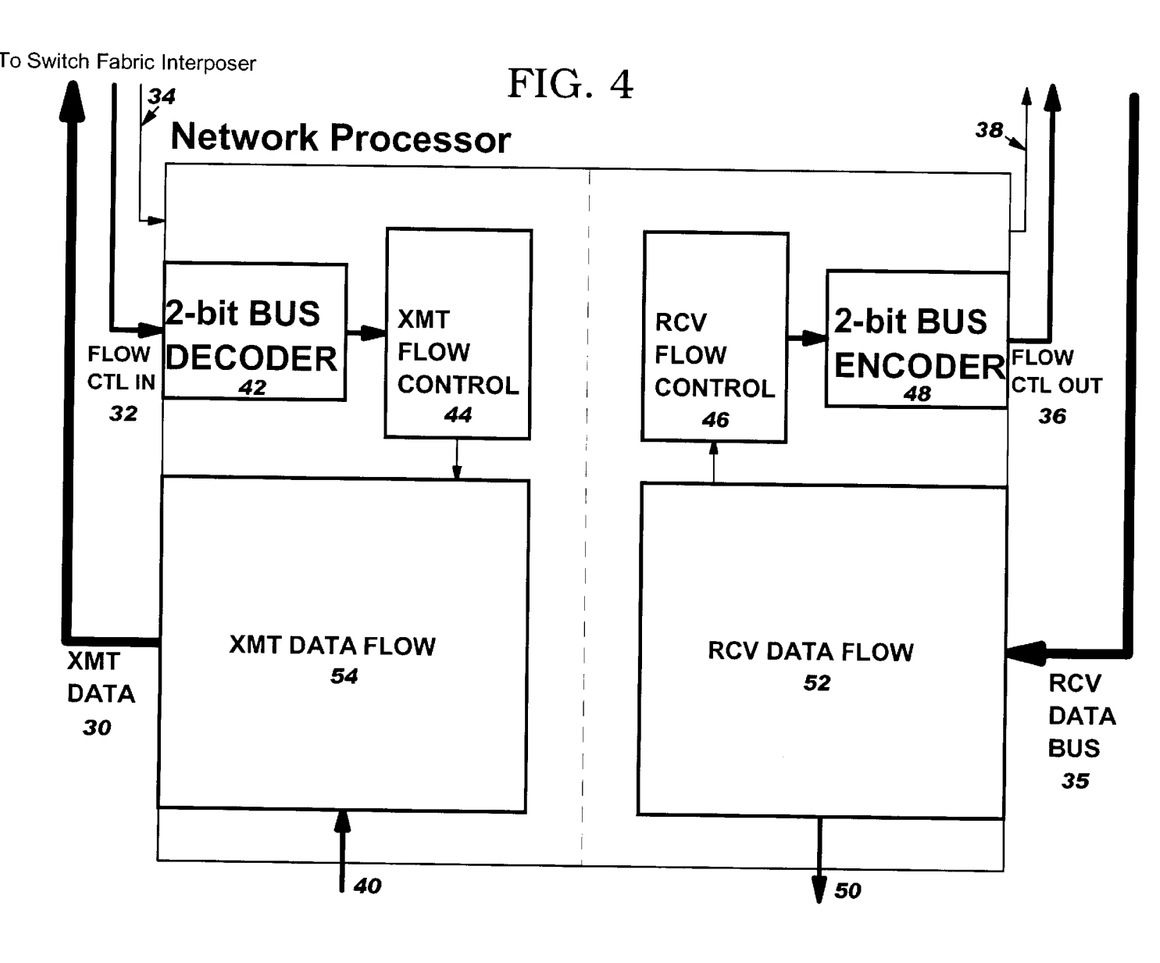
FIG. 4 shows a block diagram of a network processor including the teachings of the present invention.

FIG. 4 shows a block diagram of a network processor identifying only the parts which are germane to the present invention. The media interconnecting the network processor to its respective switch fabric interposer are identified by the same numerals used to identify these interconnections in FIG. 3. The network processor is a device that performs several network functions including address translation, quality of service management, classification of received packets, and other functions. The network processor is a known network device and details of this device can be obtained from application Ser. No. 09/384691. As a consequence, only those portions of the network processor germane to the present invention will be discussed further. The network processor includes transmit data flow 54 receiving data on input bus 40 and outputting the data on transmit data bus 30 to switch fabric interposer. The switch fabric interposer in turn returns status information, including indication of the level of congestion experienced by switch resources allocated to each of the destinations through the switch, on flow control in status channel 32.

The timing signals are also returned on clock channel 34. The 2-bit bus decoder 42 receives the status information and clock and decodes them in the way described above. An output signal of the digital data stream generated from the received coded information is transmitted to flow control 44. The transmit flow control 44 output control signals which prevent the transmit data flow 54 from sending data during receipt of negative status information. Stated another way the decoded information from the status channel 32 is used to regulate data output from the transmit (XMIT) Data Flow 54.

Still referring to FIG. 4, the Receive side of the Network Processor replicates the reverse of what happens on the Transmit side. In particular, data from the switch fabric interposer is received on receive data bus 35 and forwarded into receive data flow 52. The receive data flow 52 outputs control signals, into the receive flow control 46, which indicates the congestion status of resources within the RCV Data Flow 52. For example, the control signals may give congestion status of queues etc. The RCV Flow Control 46 converts the control signal into a digital stream of bits from which encoder 48 generates the status and clocking information that is transferred to the switch fabric interposer informing said switch fabric interposer of congestion status in the receive data Flow 52. Because the switch fabric interposer knows the congestion status of resources in the RCV Data Flow 52, the Switch Fabric interposer can adjust data on the RCV Data Bus 35 so as not to overflow resources in the RCV Data Bus.

Figure 5:
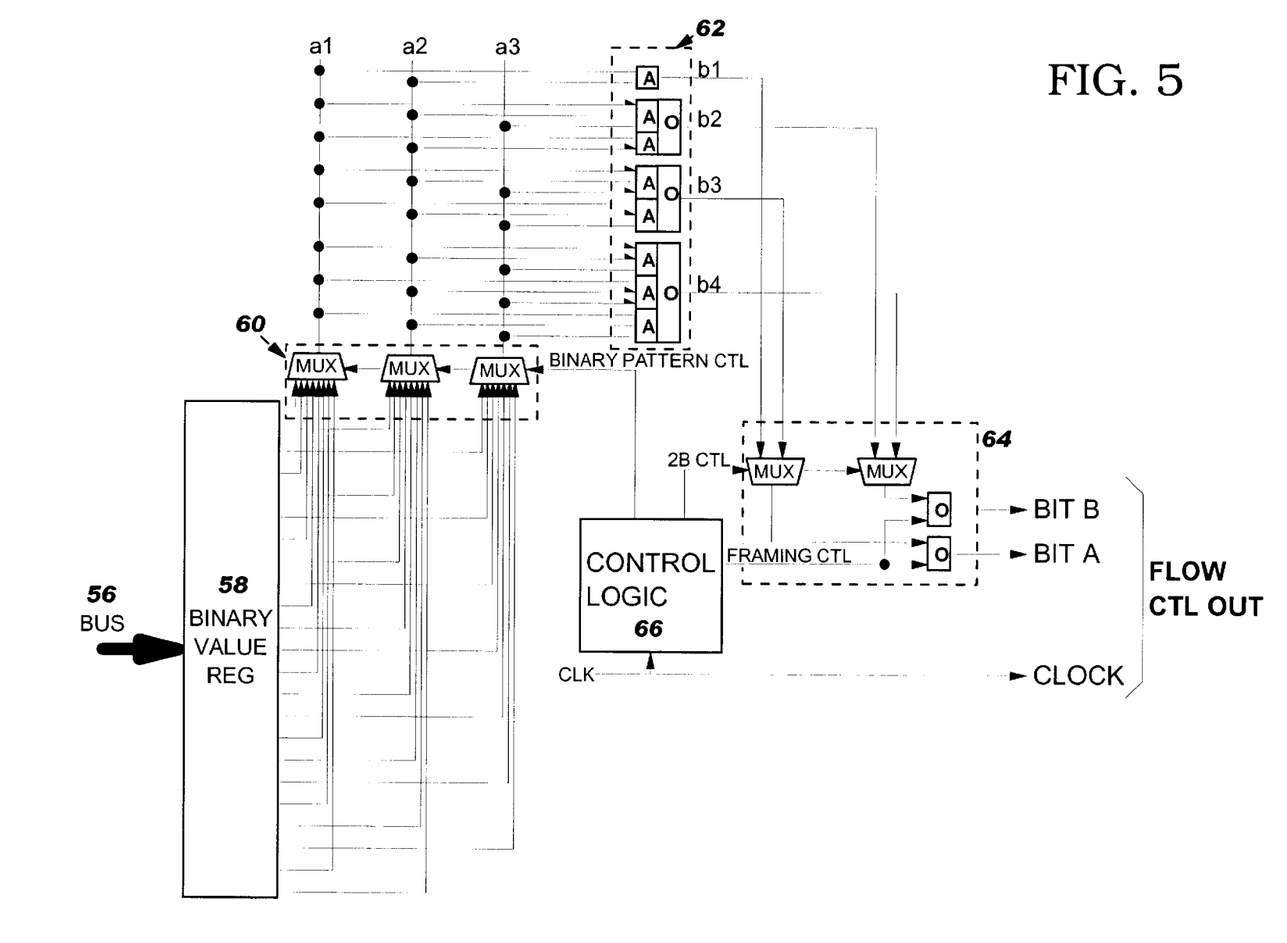
FIG. 5 shows a logic circuit arrangement for the Encoder used with a single channel.

FIG. 5 shows a block diagram of the encoder logic according to the teachings of the present invention. The encoder logic receives a digital data string, for example on bus 56 partitions the logic into groups of 3-bits which are converted into groups of 4 bits and transferred with appropriate clocking signals on the 2-bit status channel. To this end the encoder includes binary value register (reg) 58 which has several register positions to buffer the digital string from bus 56. Partition logic 60, including N MUXes partitions the data into groups of three (a1, a2, a3) bits. As shown in FIG. 5, N is equal to 3; and, with reference to FIG. 1 assuming the binary value of the data stream is 24 bits, 3 MUXes would handle 8 bits to generate the binary patterns a1, a2, a3. The binary patterns a1, a2, a3 are fed into pattern generation logic 62 which generates the coded pattern b1 b2 b3 and b4. In the embodiment shown in FIG. 5 b1 is generated by the AND gate, b2 b3 are generated by two-way AND/OR gates and b4 is generated by a 3-way AND/OR gate. The coded patterns b1 b2 b3 and b4 are fed into selection logic 64 which includes two MUXes and two OR gates, each one generating Bit A and Bit B, respectively. The Control Logic 66 receives a clock which is transmitted on the clocking channel and is used to generate the necessary control signal used to gate the MUXes in the partitioning logic 60 and the MUX and OR gates in selection logic 64. It should be noted that the framing pattern '11' on the status channel is generated by the Control Logic 66 and the OR gates within selection logic 64.

Figure 6:
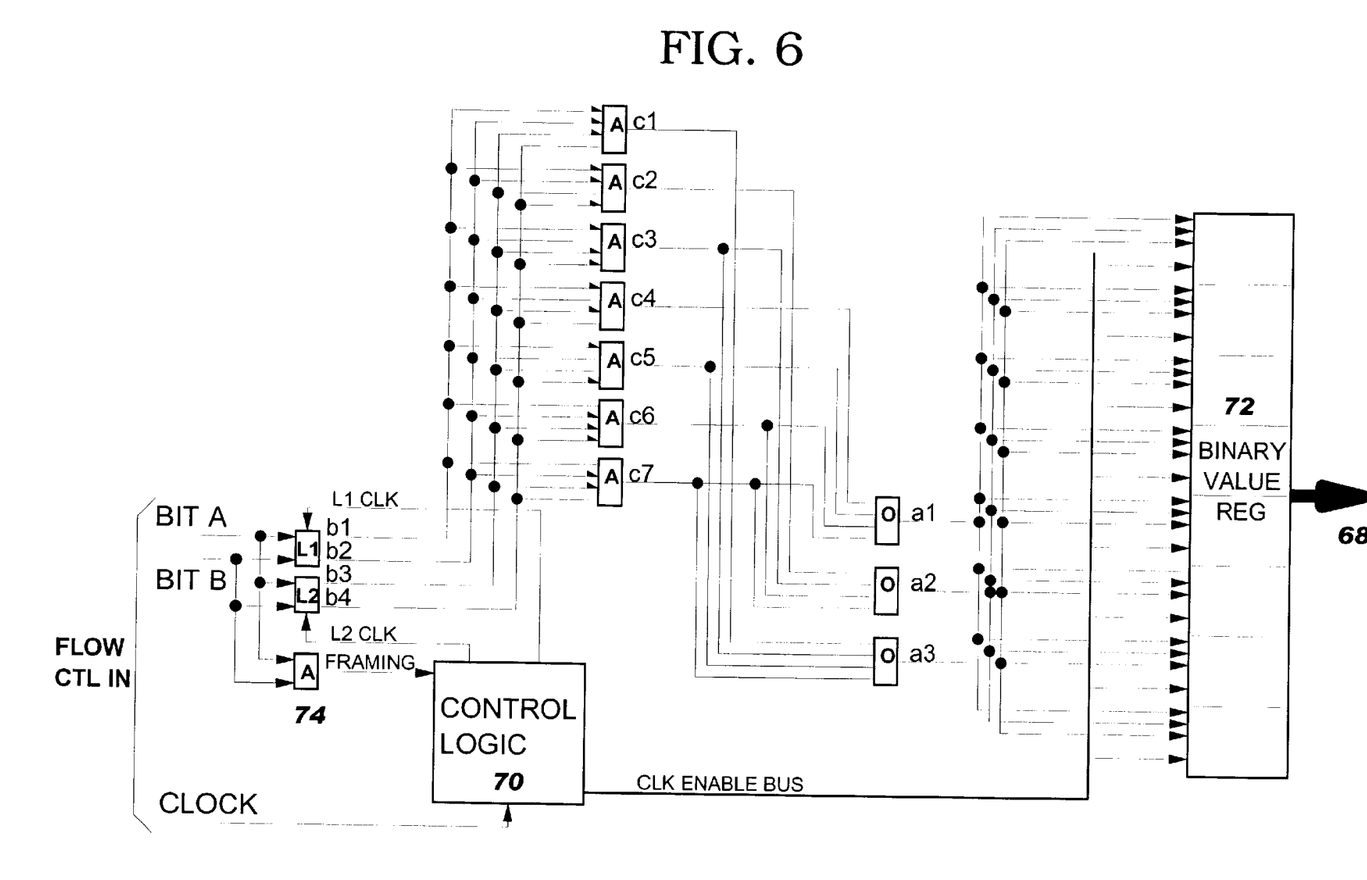
FIG. 6 shows a logic circuit arrangement for the Decoder used with a single channel.

FIG. 6 shows the logic circuit for the decoder. As stated above the decoder receives 4 bits and clock signals from the status channel and clock channel, converts the 4 bits into the 3-bit binary patterns and into the digital bit stream which is outputted on bus 68. The decoder includes control logic 70 which receives the clock from the clock channel and generates L1 clock, L2 clock and clocks on the bus labelled CLK Enable Bus. AND gate 74 detects the '11' bit framing signal which is outputted on the line labelled Framing and is used to reset the control logic 70. L1 clock and L1 latch generate the b1 b2 coded patterns while L2 clock and L2 latch generate the b3b4 coded patterns. The output from the L1 and L2 latches are fed into AND gates labelled C1 through C7. The AND gates, whose negative inputs are indicated by a wedge, generate the pattern which is marked as C1 through C7 on the code table FIG. 2C. The output from respective AND gates are fed into a set of OR gates which generate the binary patterns a1 a2 a3. The binary patterns with the appropriate clock pulses on the clock enable bus clock the appropriate bits into Binary Value Reg 72 and onto bus 68.

FIGS. 7A, 7B and 7C show a graphical representation of a variable interface according to the teachings of the present invention. In FIG. 7A the clock which is generated in the source station and transmitted with the data is shown. FIG. 7B shows the channels, labelled CH1, CH2 and CH3, which transmit the data according to teachings of the present invention. It should be noted that even though three channels are shown in this embodiment, the invention is intended to cover n channels with n being any number selected by the designer. By running n channels simultaneously a relatively large bandwidth transmission system is provided.

Still referring to FIG. 7B, the framing pattern on the channel is a "11" coding pattern AB. This framing pattern is identical to the one discussed above and used in the standard. An example will be used to explain how the bits are spread or distributed among the 3 channels shown in this example. The data to be transmitted is a 24-bit binary number labelled BINARY VALUE. The Binary Value is partitioned into 3-bit patterns 000, 011, 001 and so forth. The alphanumerical expression for each of the 3 binary values are shown above each one in FIG. 7B. For example, a1a2a3 is associated with the 000 value, a1a2a3 is associated with the 011 value, and so forth. The 3-bit binary value is then converted into 4b patterns which are to be spread over the channel and transmitted to the sink. In converting the 3-bit binary value to 4 bits the 000 pattern is converted to 0000 pattern, the 011 is converted to 0100 pattern, the 001 pattern is converted to 0001 pattern, and so forth. As with the binary 3-bit pattern the alphanumerical expression associated with each of the 4-bit patterns is b1b2b3b4. According to the teaching of the invention the binary 4-bit patterns to be transmitted are spread over the 3 channels so that pairs of bits within each 4-bit pattern are spread over different transmission channels with each pair being clocked by adjacent clock pulses.

Still referring to FIG. 7B, arrows pointing from transmitted 4-bit patterns to brackets indicate the channels in which pairs of bits from the 4-bit pattern is spread. As a consequence, the framing bit 11 is placed in channel 1 in bit position A1 and B1. According to the teachings of the present invention the first 4-bit pattern to be distributed after the framing pattern cannot be placed in the same channel 1 in which the framing pattern is placed. The first 4-bit pattern to be transmitted is placed in channels other than channel 1. As a consequence, the first 4-bit pattern 0000 to be transmitted, following the framing pattern 11, is positioned in channel 2 and channel 3, respectively and is gated with the same clock cycle that gates the framing pattern 11. In particular, the first pair 00 is positioned as b1b2 in bit A2, bit B2 of channel 2. Likewise, the second pair of bits 00 (b3b4) are placed in channel 3 in bit position A3 and bit position B3, respectively. It should be noted that the same clock cycle is used for gating the framing bits on channel 1 and the first 4-bit pattern 0000 on channel 2 and channel 3, respectively. Thereafter, the remaining 4-bit patterns are spread in a round robin fashion in the channels CH1, CH2, CH3 until the next framing pattern "11" is placed in channel 3. In particular, the next 4-bit pattern 1001 is spread in channel 1 and channel 2, respectively. In particular, 01 of the 4-bit pattern is placed in channel 1 and 10 which is the second pair of the 4-bit pattern is placed in channel 2. The bracket bracketing 10 and 01 and the arrow pointing from the 1001 4-bit pattern indicates that the 4-bit pattern is spread in channel 1 and channel 2, respectively. In a similar manner the arrow and bracket indicates the location whereat successive ones of the 4-bit pattern are spread until the framing pattern 11 is placed in channel 3. The last 4-bit pattern of the frame 1001 is placed in channel 1 and channel 2 respectively with the same clock cycle gating them and the 11 pattern which indicates the end of the frame. The first 4-bit pattern b1b2b3b4 following the end of the frame is placed in channel 2 and channel 1.

FIG. 7C shows a code table comprising of binary pattern a1a2a3 and the corresponding 4-bit coded pattern b1b2b3b4. As discussed above some of the coded patterns are ineligible patterns because they show the framing pattern in certain bit positions of the 4-bit pattern. Those are disqualified, cannot be used, and are not shown in the code table. The arrow labelled Encoding shows the binary 3-bit pattern is encoded into the 4-bit binary pattern which is spread and transmitted down the channels which are running simultaneously. The arrow labelled Decoding shows that the coded 4-bit which is received from the channel is decoded into 3-bit binary patterns. C0 through C7 represent intermediate decoded bit values used in the first stage of the decoder: C1 to C7 are generated by the 7 AND gates shown in FIG. 6 and FIG. 9. It should be noted that C0 is not used.

FIG. 8 shows the encoder which is used to encode and spread the bits over the 3 transmission channels which are made to operate in parallel. The encoder includes a binary value register (reg) 98 receiving bits from bus 100. In regards to the example shown in FIG. 7B the binary value would be received on bus 100 and fed into position within the binary reg 98. Partitioning logic 80 is coupled to the binary value reg 98 and partitions the digital stream into the 3-bit patterns a1, a2 and a3. In this embodiment the partitioning logic 80 comprises 3 multiplexers, each one receiving 8 bits and are driven by a binary pattern control signal from control logic 86 to generate the a1a2a3 pattern. Pattern generation logic 82 receives the 3-bit pattern and converts each one into the 4-bit patterns b1, b2, b3 and b4. In the embodiment of the present invention the pattern generation logic 82 includes one AND gate generating B1 and a plurality of 2-way AND/OR gates, each one generating one of the other 4-bit patterns b2, b3 and b4. The b1, b2, b3 and b4 signals are fed into distribution logic 84 whose function it is to spread or distribute each 4-bit pattern over the appropriate transmission channel. In the example set forth in FIG. 7B there are 3 channels and the logic in FIG. 8 spreads the 4-bits over the 3 channels. In the example shown the distribution logic 84 comprises of two MUXes driven by a control signal from control logic 86 which generates signals which are fed into 6 OR gates whose outputs are fed into three latches. The MUX OR gate and first set of latches L1, L2, L3 are clocked at a rate that is three times as fast as the external clock which is labelled Slow CLK. The output from the latches L1, L2, L3, are fed into three latches L4, L5 and L6. These latches are clocked with the slow clock and provide the data that is transmitted on the channel. The slow clock is equivalent to the clock shown in FIG. 7A. Control logic 86 receives a system clock and generates the control signals which are used for gating the respective circuits in FIG. 8. The details of control logic circuit 86 are well within the skill of one skilled in the art knowing the requirements of the invention as discussed relative to FIG. 7B.

FIG. 9 shows a decoder structure which receives the 4-bit patterns from respective channels and generates, on bus 96, a serial bit stream like the one which was first fed into the encoder in FIG. 8. The decoder includes framing pattern capture circuit 88 which receives and generates the framing pattern from the respective channels. In this example the framing pattern capture circuit 88 includes a plurality of AND gates, each receiving a pair of input signals from one of the channels. The output framing pattern from the framing pattern capture circuit 88 is fed into control logic 94. The clock which is transmitted with the data is also fed into control logic 94. The 4-bit pattern b1b2b3b4 which is transmitted in the respective channels is received by bit pattern capture circuit 90. In the preferred embodiment bit pattern capture circuit 90 includes a plurality of MUXes coupled to latch L1 and latch L2. The output from latch L1 provides b1 b2 bits while the output from latch L2 provides the b3b4 bits. The b1b2b3b4 patterns are fed into pattern conversion logic 92 which generates the 3-bit a1, a2 and a3. In the preferred embodiment of the invention the pattern conversion logic 92 includes a plurality of AND gates coupled to 3 OR gates, which output a1, a2 and a3. The 3-bit patterns a1a2a3 are fed into a binary value register from which the binary data stream is outputted on bus 96. Clock pulses from the clock enabled bus generated by control logic 94 gates the appropriate bit out of the binary value register onto bus 96.

A coding method and scalable interface system is provided for enhancing the efficiency of data transmitted on a relatively narrow channel, such as a 2-bit channel. Although the present invention has been described in accordance with the embodiment shown one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system including:
   n transmission channels, n greater than 1; and
   an encoder that codes data to be transmitted on said n transmission channels, said encoder including a first circuit that partitions a bit stream into groups of 3-bit pattern;
   a second circuit that generates a 4-bit pattern for each group of 3-bit pattern; and
   a third circuit that distributes, each pair of bits in a 4-bit pattern over different ones of the n transmission channels.

2. The system of claim 1 further including a decoder that receives groups of 4-bits from different channels in an interface and converts said groups of 4-bits into a serial bit stream, said decoder includes a fourth circuit that converts each group of 4-bits into a corresponding group of 3-bits; and
   a fifth circuit that converts each group of 3-bits into the serial bit stream.

3. The system of claim 1 including a clock that gates pairs of bits in the same 4-bit pattern onto different ones of the n channels.

4. The method of claim 3 wherein adjacent clock cycles gate pairs of bits from the same 4-bit pattern into the different ones of the n channels.

5. A system including:
   a source device;
   a sink device; and
   a first interface interconnecting the source device to the sink device; said first interface including
   n transmission channels, n greater than 1; and
   an encoder that spreads a pair of bits from each 4-bit pattern to be transmitted over different ones of the n channels.

6. The system of claim 5 further including a clock channel carrying clock signals wherein adjacent clock cycles on said clock gates pairs of bits in a 4-bit, pattern that is being transported on different ones of the transmission channels in the interface.

7. The system of claim 6 further including a second interface interconnecting the source device to said sink device, said second interface including m transmission channels, m>1; and
   a decoder that collects groups of 4-bit patterns from the m channels, converts the groups of 4-bit patterns into a serial stream of information.

8. The apparatus of claim 7 wherein m=n=3.

9. A method for transmitting data comprising the acts of:
   (a) providing n transmission channels, n>1;
   (b) providing groups of 4-bit pattern to be transported by said channels;
   (c) distributing each of the group of 4-bit pattern in such a way that bits in each pair of 4-bit pattern are placed on separate ones of the n transmission channels.

10. The method of claim 9 further including the acts of providing clock signals wherein one clock cycle gates each pair of bits on different channels.

11. The method of claim 9 wherein the groups of 4-bit patterns are distributed in round robin manner to the n channels.

12. The method of claim 11 further including the acts of delineating units of information on said separate channels with a pair of framing patterns.

13. The method of claim 12 wherein each of the framing patterns includes "11" pattern.

14. The method of claim 13 wherein the first 4-bit pattern distributed after the "11" framing pattern is distributed in separate transmission channels other than the ones carrying the framing pattern.

15. The method of claim 14 wherein the same clock cycle is used to gate the "11" framing pattern and the first 4-bit pattern.

16. A system including:
   a source device;
   a sink device;
   an interface interconnecting the source device to the sink device, said interface including n transmission channels, n>1; and
   an encoder that spread bits from an m-bit pattern, m>1 over different ones of the transmission channel.

17. The system of claim 16 wherein each channel is 2 bits wide.

18. A system comprising:
   n transmission channels, n>1; and
   an encoder that distributes selected bits from at least one group of m bits, m>1, over different ones of the n transmission channels.

19. The system of claim 1 wherein at least two of the n transmission channels are 2 bits wide.

* * * * *